United States Patent
Mitsui et al.

(10) Patent No.: US 7,833,387 B2
(45) Date of Patent: Nov. 16, 2010

(54) MASK BLANK MANUFACTURING METHOD AND SPUTTERING TARGET FOR MANUFACTURING THE SAME

(75) Inventors: Masaru Mitsui, Yamanashi (JP); Toshiyuki Suzuki, Yamanashi (JP)

(73) Assignee: Hoya Corporation, Tokyo (JP)

( * ) Notice: Subject to any disclaimer, the term of this patent is extended or adjusted under 35 U.S.C. 154(b) by 1074 days.

(21) Appl. No.: 11/029,652

(22) Filed: Jan. 6, 2005

(65) Prior Publication Data
US 2005/0170263 A1    Aug. 4, 2005

(30) Foreign Application Priority Data
Jan. 7, 2004   (JP) .............. P2004-002524

(51) Int. Cl.
*C23C 14/35* (2006.01)
(52) U.S. Cl. .............. 204/192.26; 204/192.12; 204/192.15; 204/298.12; 204/298.13; 204/298.2
(58) Field of Classification Search .......... 204/192.12, 204/192.15, 192.26, 298.12, 298.13, 298.19, 204/298.2
See application file for complete search history.

(56) References Cited

U.S. PATENT DOCUMENTS

| 4,290,876 | A | * | 9/1981 | Nishiyama et al. ...... 204/298.13 |
| 5,244,556 | A | * | 9/1993 | Inoue .................... 204/192.12 |
| 6,287,437 | B1 | * | 9/2001 | Pandhumsoporn et al. ............... 204/298.13 |
| 2002/0098422 | A1 | | 7/2002 | Nozawa |
| 2003/0155235 | A1 | * | 8/2003 | Miyashita et al. ...... 204/298.12 |
| 2004/0016635 | A1 | * | 1/2004 | Ford et al. ............... 204/192.1 |

FOREIGN PATENT DOCUMENTS

| JP | 60-009873 | * | 1/1985 |
| JP | 08-291382 | * | 11/1996 |
| JP | 2001-059168 | * | 3/2001 |
| JP | 2001-59168 | A | 3/2001 |
| JP | 2001-335925 | A | 12/2001 |
| JP | 2002-90977 | A | 3/2002 |
| JP | 2002-90978 | A | 3/2002 |
| JP | 2003-43668 | A | 2/2003 |
| TW | 520401 | B | 2/2003 |

OTHER PUBLICATIONS

Machine Translation for Japanese patent 2002-090978 dated Mar. 27, 2002. (Japanese patent cited on Applicant's IDS of Jan. 6, 2005).*
Machine Translation of 2001-059168 dated Mar. 6, 2001.*
Machine Translation of Minami et al. (Japan 08-291-382) dated Nov. 5, 1996.*
Taiwanese Office Action Issued Jan. 3, 2008.
Japanese Office Action dated Jun. 13, 2008.

* cited by examiner

*Primary Examiner*—Rodney G McDonald
(74) *Attorney, Agent, or Firm*—Sughrue Mion, PLLC

(57) ABSTRACT

A sputtering target for manufacturing a mask blank having a backing plate 5 where a portion for bonding a target member 4 is protruded like the convex with respect to a base portion 5', and the target member 4 being formed to have a larger surface area than the area of the bonding portion of the backing plate 5 with extending from the bonding portion over a whole periphery with a bonding agent 30 interposed in-between, and further a metal 40 is deposited to a concave portion formed by a combination of the two structures in such a manner that the elution of the bonding agent 30 can be sealed.

23 Claims, 7 Drawing Sheets

MASK BLANK MANUFACTURING METHOD AND SPUTTERING TARGET FOR MANUFACTURING THE SAME

This application claims priority based on Japanese Patent application No. 2004-002524, filed Jan. 7, 2004, the contents of which is incorporated herein by reference in its entirety.

BACKGROUND OF THE INVENTION

1. Field of the Invention

The present invention relates to a method of manufacturing a mask blank and a sputtering target for manufacturing a mask blank.

2. Description of the Related Art

In recent years, a semiconductor device has been demanded to be processed more finely. For this reason, an exposure wavelength to be used has come to be shorter than before. With respect of such a short exposure wavelength, various technical requirements are demanded for realizing such a mask blank more severely.

For example, a light translucent film (a halftone phase shift film) in a phase shift mask blank of a halftone type is employed to meet the demanded requirements from both aspects of a light transmittance and a phase shift amount for an exposure wavelength to be used.

With respect of such a short exposure wavelength, furthermore, it is also necessary to reduce a variation in a phase angle and a transmittance, which occurs among the mask blanks or in a mask blank plane itself, as much as possible in order to bring the mass production to the practical level. In a mask blank for a short wavelength, for example, an ArF or $F_2$ excimer laser, a variation in a phase angle and a transmittance between blanks or in a plane in a mask blank for conventional i rays and a KrF excimer laser is great and a yield is also deteriorated. For this reason, an exact application cannot be carried out.

Under such a circumstance, a considerable change of the method or the apparatus has been further taken place in order to meet the demanded requirements apart from an extension of a conventional method or a conventional apparatus for manufacturing a mask blank.

More specifically, a mask blank to meet the demanded requirements is manufactured in a way such that films are formed by using a DC magnetron sputtering apparatus having the vacuum chamber in which a substrate holding table with a rotating mechanism, and a sputtering target opposed to the substrate in a position such that a center of the sputtering target is shifted from the central axis of the substrate in a predetermined angle to form a film while rotating a substrate with keeping a sputtering conditions in a constant state among a plurality of the substrates, such as disclosed in Japanese patent publication JP A 2002-90978. By this manufacturing method, it is possible to reduce the variation in the phase angle and the transmittance among the mask blanks or in a mask blank in the plane, which enables the mass production of a mask blank for a short wavelength, such as an ArF or $F_2$ excimer laser, to be practical level.

In reflection of the reduction of the exposure wavelength, furthermore, the requirement for reducing a particle and a pinhole becomes more severely. In the mask blank for a short wavelength such as an ArF or $F_2$ excimer laser, for example, it is also necessary to reduce the numbers of particles or pinholes as much as possible having the diameter that is larger than the half of the exposure wavelength in order to implement the practical use.

In order to meet such a demand, there is employed a manufacturing apparatus, more specifically, it might be a vacuum chamber of a DC magnetron sputtering apparatus which is comprised of a sputtering target having a target surface provided downward in the direction of a gravity, a substrate holder provided opposite to the target, and a shield disposed on the internal wall of the vacuum chamber in the same vacuum chamber using the above apparatus to form a mask blank which is manufactured by a film using a sputter-down formation method, such as disclosed in JP A 2002-90977.

With respect of the reduction in the exposure wavelength, both of the requirements that has been already mentioned above are demanded. In other words, reducing a variation in the phase angle and the transmittance among the mask blanks or in the mask blank in a plane, and suppressing the numbers of particles and pinholes are necessary for the mask blanks for a short wavelength such as ArF or $F_2$ excimer laser to implement the practical use.

In order to manufacture a mask blank to meet these demanded requirements, there was employed a manufacturing apparatus combining both of the above structures together. That is, this combined structure presents a manufacturing apparatus which a DC magnetron sputtering apparatus, more specifically, it might be a vacuum chamber of a DC magnetron sputtering apparatus which is comprised of a substrate holding table having a rotating mechanism, a sputtering target opposed to a substrate in a position such that a center of the sputtering target is shifted from the central axis of the substrate in a predetermined angle where a target surface is provided downward in the direction of a gravity, and a shield provided on the internal wall of the vacuum chamber thereof, where approximately 100 mask blanks having light translucent films are continuously formed on the substrate by rotating the substrate with keeping a sputtering condition in a constant state between a plurality of substrates. As a result, however, there was a problem in that the particles with relatively large size (for example, a diameter of 300 nm or more) appear on the substrate. As the result of those particles being analyzed, it was found that most of the particles are constituted by In (indium) contain materials. This In is used as a bonding agent for bonding a target member to a backing plate in the sputtering target. For this reason, the source of generation of the particles might be the sputtering target. Although the particles of this type are rarely detected as the result of forming small number of the thin films, more the number of the formed films, more the number of the particles are generated. In this regard, in order to enhance the productivity of the mask blank, it is necessary to solve the problem of the generated particles.

SUMMARY OF THE INVENTION

The present invention overcomes at least the foregoing related art problems and disadvantages, and meets at least the foregoing unmet needs. More specifically, the invention has an object to provide a sputtering target which is suitable for manufacturing a mask blank for a short wavelength such as an ArF or $F_2$ excimer laser and a method of manufacturing the mask blank for a short wavelength which is excellent in a mass-productivity.

The above object of the invention is accomplished by the first aspect of this invention which provides a method of manufacturing a mask blank having a thin film for forming a mask pattern on a substrate, wherein the thin film is formed by a sputtering method using a sputtering target of which target member and backing plate are bonded to each other with a bonding agent, and further wherein a metal film is formed on a side wall of the sputtering target so as to prevent the bonding agent from being exposed.

Further, the above object of the invention is also accomplished by the second aspect of this invention based on the first aspect of this invention, wherein the sputtering method to form the thin film is performed by arranging a surface of the substrate to be provided upward while a target side of the sputtering target is provided at an angle of 0 to 90 degrees to a direction of a gravity.

Still further, the above object of the invention is also accomplished by the third aspect of this invention based on the first to second aspects of this invention, wherein the backing plate has a base portion and a bonding portion where the bonding portion is convexly protruded from the base portion in order to bond the target member on a top surface thereof, and further wherein a bonding-side area of said target member is larger than an area of the bonding portion of the backing plate so that the target member has a flange portion extending from a whole periphery of the bonding portion of the backing plate.

More over, the above object of the invention is also accomplished by the fourth aspect of this invention based on the third aspect of this invention, wherein said method is applied to a sputtering method using an overall erosion type magnetron cathode.

According to the fifth aspect of this invention, a sputtering target for manufacturing a mask blank is provided which is comprised of the backing plate which has a base portion and a bonding portion, where the bonding portion is convexly protruded from the base portion in order to bond the target member on a top surface thereof, the target member which has surface area being larger than an area of the bonding portion of the backing plate, and said target member is bonded to said bonding portion so that the target member has a flange portion extending from a whole periphery of the bonding portion of the backing plate, and the metal film which is formed on a side wall of the sputtering target so as to prevent the bonding agent from being exposed.

According to the sixth aspect of this invention, a sputtering target for manufacturing a mask blank which is used for manufacturing a mask blank having a thin film to form a pattern on a substrate is provided, which is comprised of a target member for forming the thin film, a backing plate, and a bonding agent by which the target member and backing plate are bonded to each other, wherein the target member has such a thickness that the bonding agent is not eluted by an influence of a heat applied to the bonding agent during the sputtering target being used for forming the thin film.

According to the seventh aspect of this invention, the sputtering target for manufacturing a mask blank according to the fifth and sixth aspects of this invention, wherein the sputtering target is provided in such a manner that the target member is positioned on a gravity direction side from the bonding agent when the thin film is to be formed.

According to this invention, it is possible to prevent or reduce the generation of the particles on the substrate which are caused by the bonding agent bond, bonding the target member and the backing plate, that is eluted to the side surface of the target in the direction of a gravity by the influence of a heat applied to the bonding agent and a gravity applied to itself.

According to the sputtering target in accordance with the invention, it is possible to prevent or reduce the generation of the particles on the substrate which result from the bonding agent. Consequently, it is possible to continuously form a plurality of films without causing the problem of the generation of the particles resulting from the bonding agent. It is possible to stably manufacture a mask blank for a short wavelength such as an ArF or $F_2$ excimer laser.

DESCRIPTION OF THE PREFERRED
EMBODIMENTS

Embodiments of the present invention will be described hereinbelow by reference to the drawings. Unless otherwise specifically defined in the specification, terms have their ordinary meaning as would be understood by those of ordinary skill in the art.

Figure 10:
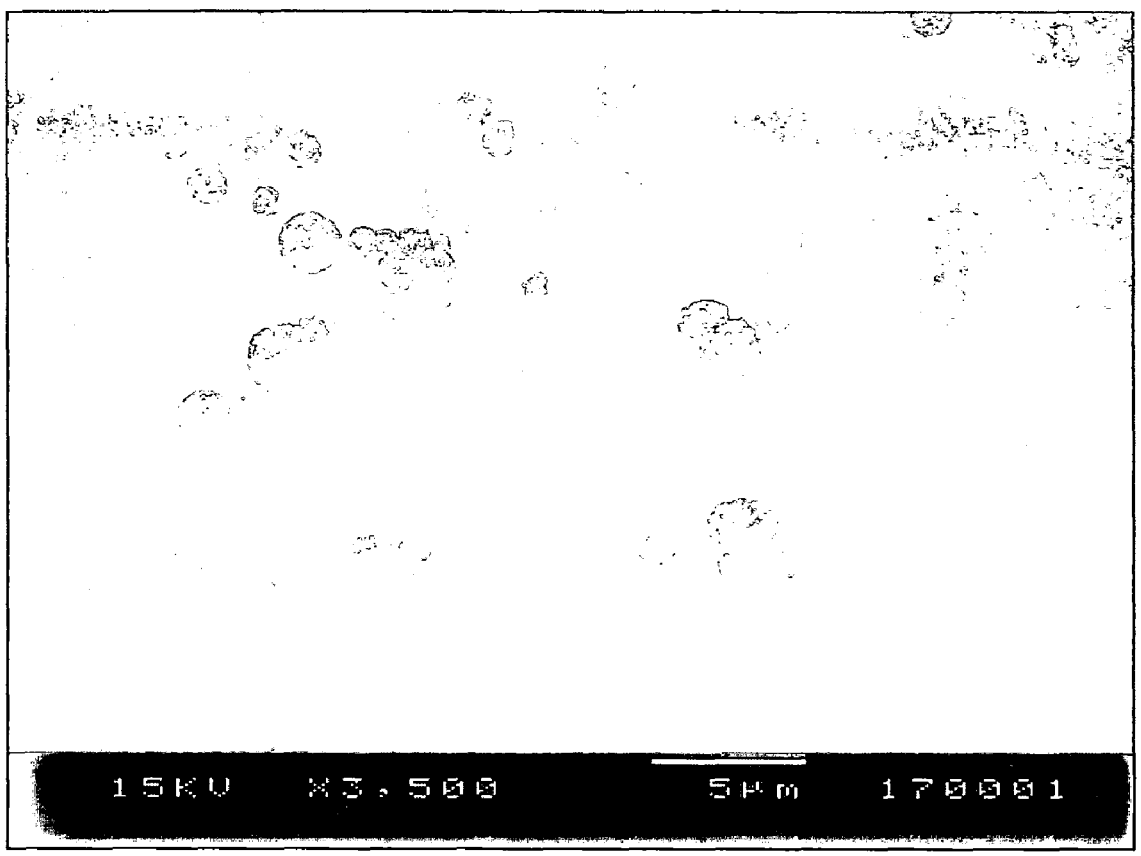
FIG. 10 is a view showing an electron microscope (SEM) for indium contain particles which are intended for the application.

First, detailed study has been conducted for the mechanism of the generation of In contain particles on a substrate. As the result, it was found that In which is provided diagonally downward in the direction of the gravity is dislocated from a bonding portion in a sputtering target when a plurality of light translucent films is continuously formed on the substrate by using the DC magnetron sputtering apparatus. Furthermore, the side surface of a target member in the vicinity of the bonding portion was observed by a scanning electron microscope (SEM), where a large number of In particles having a round shape were observed as shown in FIG. 10.

Figure 11:
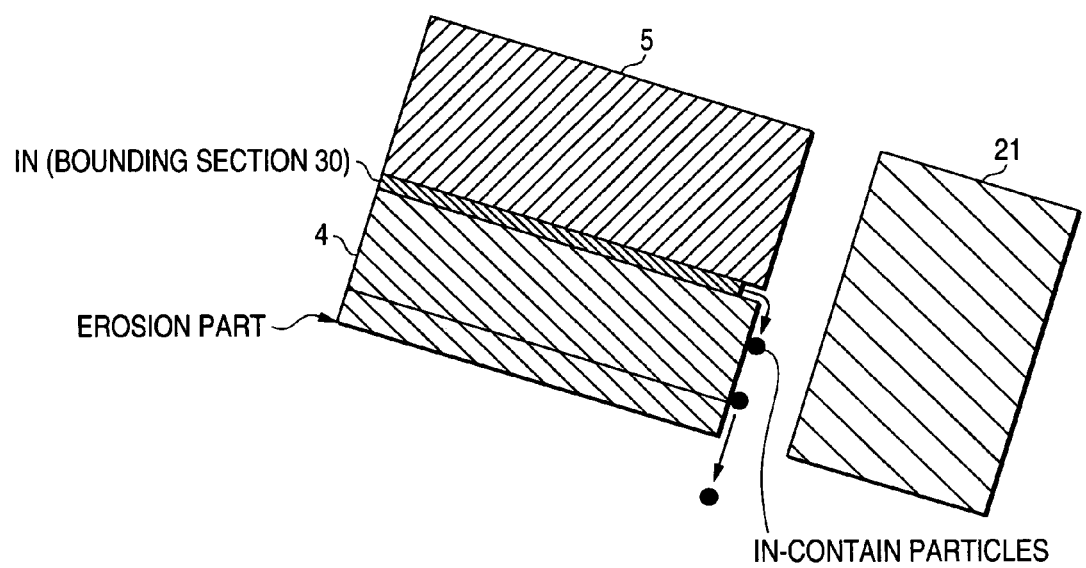
FIG. 11 is a typical view for explaining a phenomenon in which the indium contain particles intended for the application are generated.

From the foregoing, it is supposed that this phenomenon occurs by the complex factors as described below:

(1) a structure in which the DC magnetron sputtering apparatus employs a whole-area erosion sputtering target, and therefore, the end of the target is heated by a discharge and a heat is easily transferred to the end of the In (a melting point of approximately 157° C.) in the bonding portion, (2) a structure in which the DC magnetron sputtering apparatus comprises a shield which is provided in a close position to the peripheral portion of the sputtering target (a position at an interval of approximately 1 mm from the side portion of the target) of which temperature control is approximately set to 80 to 120° C., however, temperature of 120° C. or more might be also set depending on a sputtering condition, and the heat of the shield is easily transferred to the In of the bonding portion, (3) a structure in which the DC magnetron sputtering apparatus employs the sputtering target provided diagonally downward and In which is molten or softened by the heat is promoted to dislocate by a gravity, and (4) a structure in which the whole-area erosion sputtering target to be used in the DC magnetron sputtering apparatus bonds a target member to a backing plate with a bonding agent interposed between the whole back face of the target member and the backing plate in order to uniformly cool the whole surface of the target member (that is, the areas of bonding surfaces in the whole back face of the target member and the backing plate are almost equal to each other) as shown in FIG. 11. Based on the investigations of the complex factors, the invention has been made.

As for the method and apparatus for manufacturing a mask blank which has conventionally been employed, although the In has been employed as the bonding agent for bonding the target member to the backing plate, the generation of the In contain particles was not confirmed and did not become a problem because In contain particles are generated with difficulty by the employment of the sputtering target provided upward in the direction of the gravity, or by the employment of a non-whole-area erosion target or the unemployment of the shield provided around the target.

The inventors of this invention firstly developed a structure using a sputtering target which seals the elution of the bonding agent in order to hinder (block) the elution of the bonding agent by the influence of the heat applied to the bonding agent as well as by the influence of the gravity applied to the bonding agent. This is based on the supposition such that the particles resulting from the bonding agent are caused by the complex factors. More specifically, first of all, the technique using a target having a metal film (a sealing metal portion having the function of sealing the elution of the bonding agent) formed on the side wall of the sputtering target was employed in order to prevent the exposure of the bonding agent. In the case in which the metal film is formed on the side wall of the sputtering target in order to prevent the exposure of the bonding agent, it is preferable that the metal film should have such a thickness as to form the sealing metal portion having the function of sealing the elution of the bonding agent.

Referring to these structures, its application comes to have a remarkable advantages in the method of manufacturing a mask blank in which the target surface of the sputtering target is provided at an angle in the direction of the gravity or a transverse direction (a perpendicular direction to the direction of the gravity) and a thin film is thus formed on a substrate by a sputtering method in addition to the case of the sputtering target having the target surface provided downward in the direction of the gravity.

Figure 1:
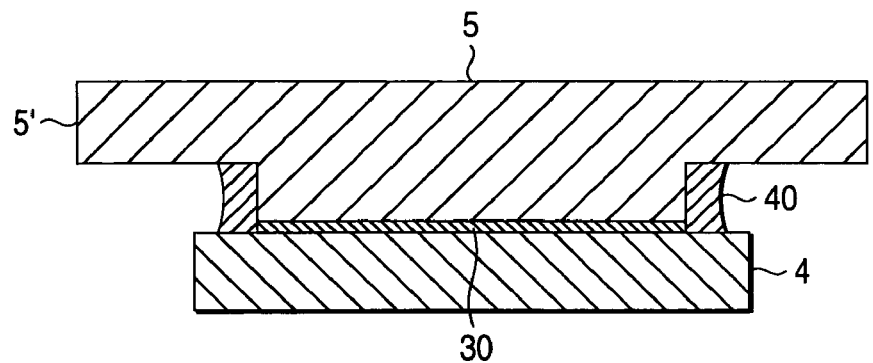
FIG. 1 is a typical view showing an embodiment of a first sputtering target according to the invention.

As the fist embodiment of this invention, the inventors devised the structure of the sputtering target in the application of the technique, and, as shown in FIG. 1, First, a backing plate 5 is employed with a structure taking a convex shape in which a portion to bond a target member 4 is protruded convexly from a base portion 5'. As to the top surface of the protruded portion, it serves as a bonding portion or bonding surface for bonding the target member 4.

Further, the target member 4 is constituted to have a bonding-side area which is larger than the area of the bonding portion of the backing plate 5 so as to form a flange portion of the target member which is extended from a whole periphery of a bonding agent 30 interposed between the backing plate and the target member.

Moreover, a metal 40 is deposited in such a manner that the elusion of the bonding agent can be sealed in a concave portion that is formed like an overhung shape by the combination of the backing plate and the target member, however preferably, the cooling efficiency of the flange portion of the target member should not be spoiled.

Figure 2:
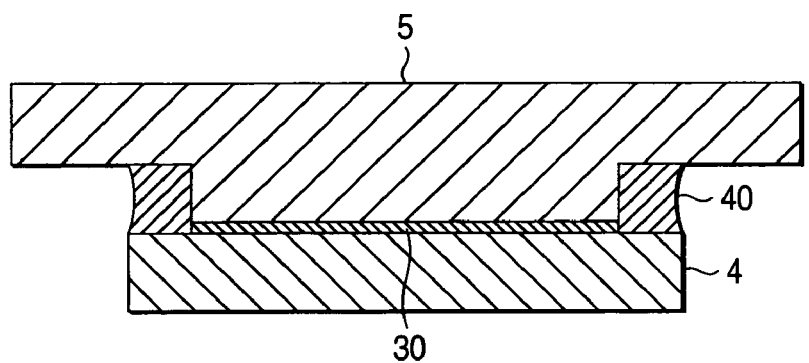
FIG. 2 is a typical view showing another embodiment of the first sputtering target according to the invention.

In reflection of this demand, the metal is deposited in the concave portion including the back face of the target member in such a manner that more than half of the concave portion, including the end of the flange portion of the target member, is substantially filled up by the metal such as shown in FIG. 1, or more preferably, the metal should fill up substantially the concave portion such as shown in FIG. 2. In this ways, the cooling efficiency of the flange portion of the target member is not spoiled. As for the metal to be deposited, a metal having a high conductivity, cooling property and a high adhesion is preferably employed for the target member and the backing plate, and furthermore, a metal formed by substantially the same material as the backing plate is preferable. Examples of the metal to be deposited include Cu and Al, and particularly, a Cu contain material is preferable and oxygen free copper having a slightly small strength and used usually for the backing plate is preferable. For a method of sticking a metal, a method capable of maintaining the certainty of sealing over a whole periphery is preferable and metal spraying is taken as an example.

It is possible to produce a sealing space being maintained by the concave portion formed by the combination of the two structures, and as the result, a sealing workability is enhanced and the certainty of sealing over the whole periphery can be maintained. This advantage becomes remarkable in the case in which the sealing is carried out by the metal spraying to be performed by a manual work under existing circumstances.

It is preferable that a distance at which the target member extending from the bonding portion of the target member and the backing plate (or the length of the flange portion of the target member) should be in a range from 0.5 to 5 mm where approximately 1 mm (from 0.5 to 1.5 mm) might be preferable to cool the whole surface of the whole-area erosion sputtering target more uniformly. The reason is as follows. Also in a structure in which a metal formed by substantially the same material as the backing plate is deposited to fill up the concave portion in such a manner that the cooling efficiency of the flange portion of the target member is not spoiled, it can be supposed that the cooling efficiency might be eventually reduced slightly as compared with a conventional manner in which the flange portion of the target member is not formed and cooling is carried out only by an integral backing plate. When the length of the flange portion of the target member is made greater than 1.5 mm, the target member might be likely to peel-off from the backing plate. To the contrary, when the length of the flange portion of the target member is made smaller than 0.5 mm, it is difficult to hold a sealing space which is required for the present invention, to enhance a sealing workability and to maintain the certainty of sealing over a whole periphery. In the case in which the sealing is carried out by the metal spraying to be performed by a manual work under the existing circumstances, this becomes remarkable.

Moreover, employing the baking plate having a structure of a whole convex shape in which the portion for bonding the target member is protruded like a convex with respect to the base portion, it makes difficult to flex the backing plate and possibility of the target member being broken can be extremely reduced. Therefore, it is possible to employ the material which is rigid and easily broken, for example, an (Si rich) MoSi contain material having more excessive Si than a stoichiometrically stable composition, in case of forming the target member.

In addition, it is preferable that a surface roughness (Ra) of the metal to be deposited to the concave portion should be set to a predetermined range where the peeling of a film deposited to the surface of the metal can be prevented. In this regard, a sprayed metal creates the surface roughness (Ra) relatively large, which can easily be set into the preferable range.

As the second embodiment of this invention, the inventors also developed a technique using a sputtering target which is wholly formed by a target member to obtain a desirable film in order to solve the problems caused by the elution of the bonding agent by the influence of a heat applied to the bonding agent and the influence of a gravity applied to the bonding agent based on the supposition that the particles resulting from the bonding agent which are intended for the application are generated by compound factors.

Figure 3:
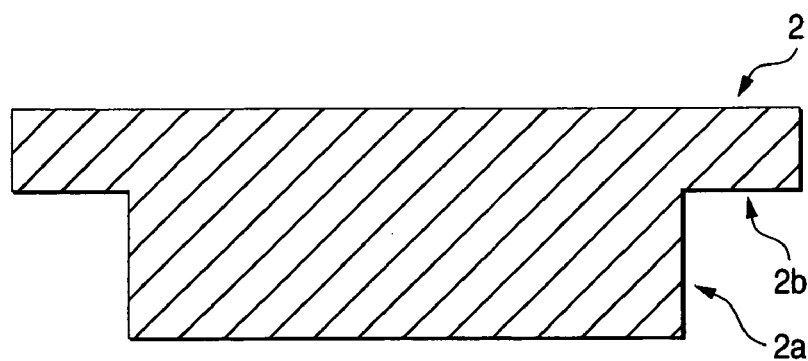
FIG. 3 is a typical view showing an embodiment of a second sputtering target according to the invention.

According to the technique, as shown in FIG. 3, a whole sputtering target 2 has such a structure as to be integrally formed by a target member (there is employed a structure in which the bonding agent is not used). Therefore, the problem of the elution of the bonding agent is not caused.

The exposed surfaces 2a and 2b of the sputtering target 2 should be preferably roughened by using a method such as a blast process (a process for roughening a surface mechanically and physically) in order to prevent a film deposited to the portion from peeling off.

As the third embodiment of this invention, a sputtering target was developed in which a target member with such a thickness as to reduce the elution of the bonding agent is employed, which ends up reducing the influence of a heat applied to the bonding agent that is bonded to the backing plate, and solves the problems caused by the elution of the bonding agent with the influence of a gravity applied to the bonding agent. This is because the particles are supposed to be caused by the complex factors.

Figure 4:
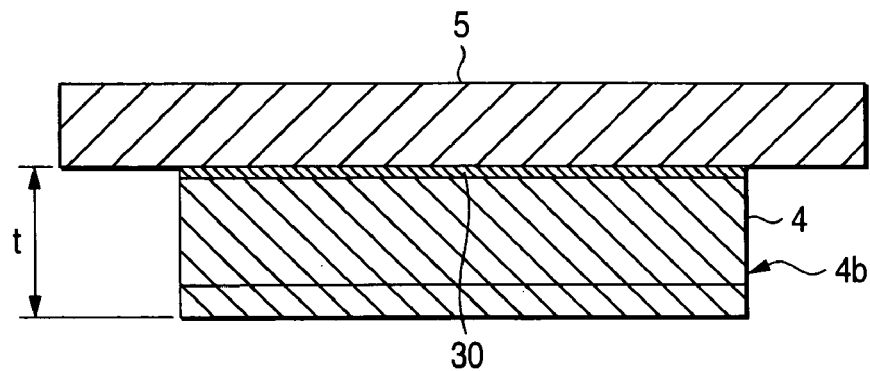
FIG. 4 is a typical view showing an embodiment of a third sputtering target according to the invention.

According to the technique, a thickness t of the target member 4 is made greater than an ordinary thickness in order to reduce the elution of the bonding agent as shown in FIG. 4. Also in the case in which an whole-area erosion sputtering target is employed and the whole surface of the target is heated by a discharge (plasma) so that the end of the target is heated, therefore, the heat is transferred to the bonding portion with difficulty, and similarly, the heat of a shield provided in a close position to the side portion of the sputtering target is transferred to the bonding portion with difficulty. Consequently, the elution of the bonding agent 30 can be reduced and defects caused by the elution of the bonding agent 30 can be decreased.

Moreover, the thickness t of the target member 4 is greater than the ordinary thickness and the side surface of the target member 4 is long. Therefore, it is possible to increase a distance between the bonding agent 30 and the end (erosion portion) of the surface of the target member 4. The bonding agent 30 such as indium reaches the end (erosion portion) of the surface of the target because of the increase in the moving distance. Consequently, it is possible to decrease the defects caused by the elution of the bonding agent 30. In this case, if a side surface 4b of the target member 4 is roughened by using the method such as the blast process, the bonding agent 30 such as indium is moved with more difficulty over the side surface 4b of the target member 4, which is preferable for preventing the film deposited to the side surface 4b of the target member 4 from peeling off.

It is preferable that the thickness t of the target member 4 should be 5 to 15 mm.

In the invention, the target member is properly selected to meet the purpose.

The backing plate is a metal for fixing the target member in sputtering and can be constituted by a metal having an excellent conductivity and cooling property, for example, a metal such as a Cu contain or an Al contain.

Detailed description will be given to a DC magnetron sputtering apparatus (Patent Document 1 and Patent Document 2) which is particularly suitable for the method of manufacturing a photomask blank according to the invention.

Figure 7:
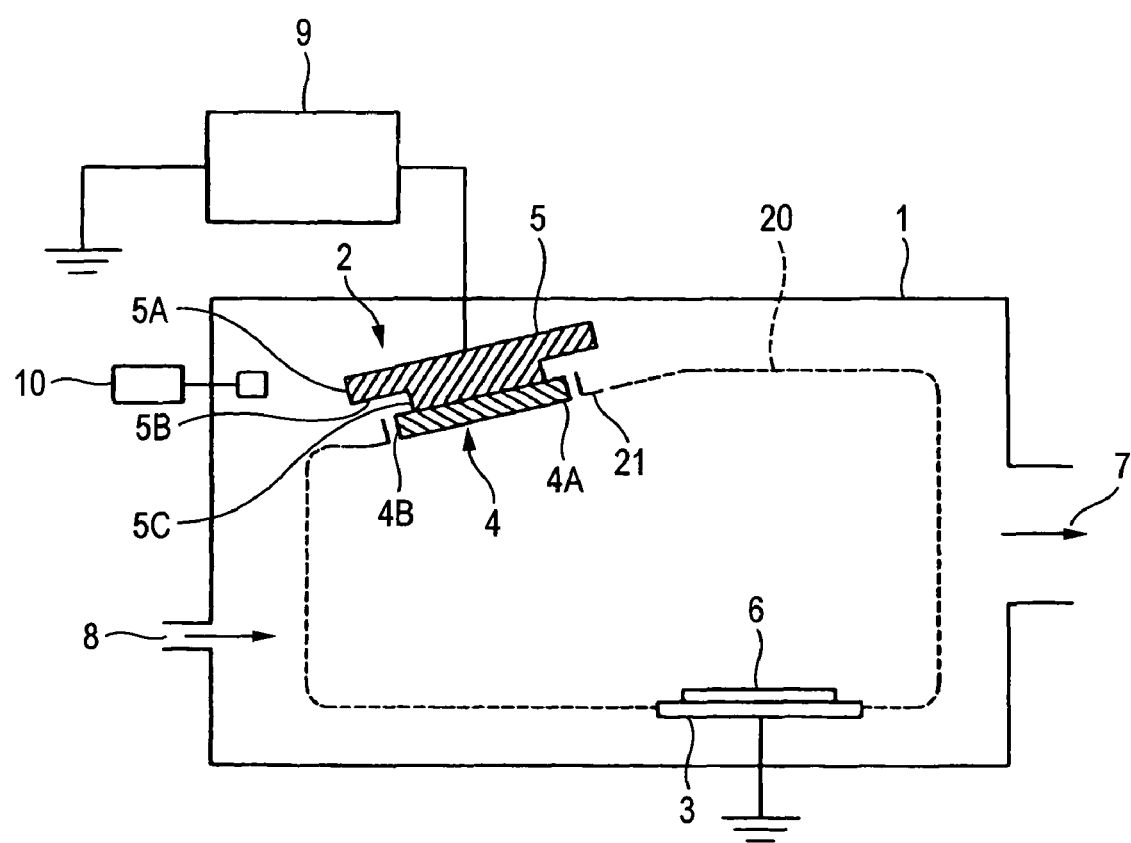
FIG. 7 is a typical view showing a sputtering chamber in a DC magnetron sputtering apparatus used in the example.

A DC magnetron sputtering apparatus shown in FIG. 7 has a vacuum chamber 1, and a sputtering target 2 and a substrate holder 3 are provided in the vacuum chamber 1. The sputtering target 2 employs an oblique sputtering method in which a target surface is provided diagonally downward. In the sputtering target 2, a target member 4 and a backing plate 5 are bonded to each other through an indium contain bonding agent. An whole-area erosion magnetron cathode (not shown) is attached to the back of the sputtering target 2. The backing plate 5 is cooled directly or indirectly by means of a water cooling mechanism. The magnetron cathode (not shown) is electrically coupled to the backing plate 5 and target member 4. Exposed backing plate surfaces 5A, 5B and 5C are roughened by using a method such as a blast process (a process for roughening a surface mechanically and physically). A side surface 4B of the target member 4 is roughened by using the method such as the blast process. A transparent substrate 6 is attached to the rotatable substrate holder 3.

A shield 20 to be a removable film deposit preventing component (having a structure in which a temperature can be controlled) is provided on the internal wall of the vacuum chamber 1. An earth shield 21 portion in the shield 20 is electrically grounded to the target 2. The earth shield 21 is provided above a target surface 4A (on the backing plate 5 side).

A gas is ejected from the vacuum chamber 1 through a vent 7 by means of a vacuum pump. After an atmosphere in the vacuum chamber 1 reaches a degree of vacuum which does not influence the characteristic of a film to be formed, a mixed gas containing nitrogen is introduced from a gas introducing port 8 and a negative voltage is applied to the whole-area erosion magnetron cathode (not shown) by using a DC power supply 9, thereby carrying out sputtering. The DC power supply 9 has an arc detecting function and can monitor a discharge state during the sputtering. A pressure in the vacuum chamber 1 is measured by a pressure gauge 10.

The transmittance of a light translucent film to be formed on the transparent substrate 6 is regulated by the contain and mixing rate of the gas to be introduced from the gas introducing port 8.

In order to reduce the in-blank distributions (in-plane variation) of a phase angle and a transmittance to be ±2 degrees and ±4 degrees respectively, it is necessary to form a film while rotating the transparent substrate and to form a film while rotating the transparent substrate at an integral number of times from the start of the formation of the film to the end of the formation of the film. For this purpose, for example, it is necessary to provide a mechanism for detecting the rotating angle position of a substrate when a discharge is turned ON (the start of the formation of the film) by means of a sensor for detecting the rotating angle position of the substrate, and furthermore, turning OFF the discharge (the end of the formation of the film) when the substrate comes to the same rotating angle position as that when the substrate is rotated at the integral number of times to turn ON the discharge.

Moreover, a gas pressure in the sputtering for forming a thin film such as a light translucent film, an output of a DC power supply for the sputtering and a time required for carrying out the sputtering directly influence the transmittance and the phase angle. For this reason, it is necessary to enhance the precision of a gas flow controller, a DC power supply and other apparatuses and to improve the precision of a set signal generated from the controller. The gas pressure in the sputtering is also influenced by the exhaust conductance of the apparatus. Therefore, it is also necessary to provide a mechanism capable of accurately determining the opening of an exhaust port valve and the position of the shield.

In a film containing silicon nitride, furthermore, the gas of a water content generated from the internal wall of the vacuum chamber greatly influences the optical characteristic of the film. For this reason, it is necessary to provide a pump capable of sufficiently ejecting a gas from the vacuum chamber and a mechanism which can carry out baking over the internal wall of the vacuum chamber. The degree of vacuum in the vacuum chamber is to be approximately $2\times10^{-5}$ pa or less when a film forming speed is 10 nm/min, and is to be $1\times10^{-5}$ pa or less when the film forming speed is 5 nm/min.

Figure 8:
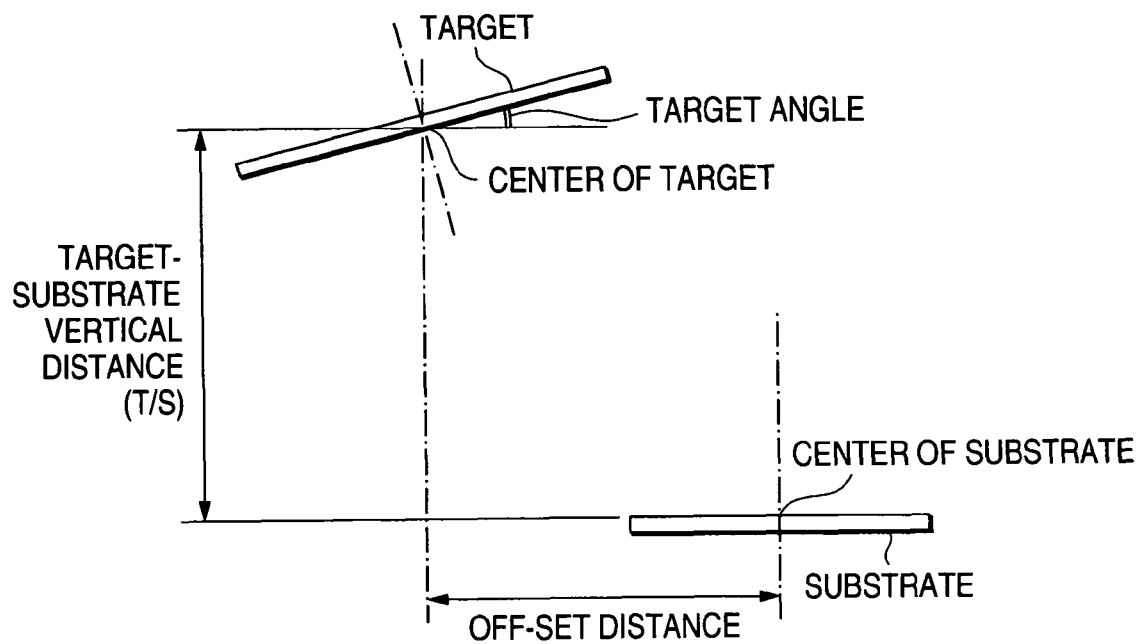
FIG. 8 is a typical view for explaining a relationship between the positions of a target and a substrate.

The in-plane distributions of the phase angle and the transmittance are also changed depending on a relationship between the positions of the substrate and the target. The relationship between the positions of the target and the substrate will be described with reference to FIG. 8.

An offset distance (a distance between the central axis of the substrate and a straight line which passes through the center of the target and is parallel with the central axis of the substrate) is regulated by an area to maintain the distributions of the phase angle and the transmittance. In the case in which the area to maintain the distribution is large, generally, a necessary offset distance is increased. For example, the offset distance is to be approximately 200 mm to 350 mm in order to implement a phase angle distribution of ±2 degrees and a transmittance distribution of ±4 degrees in a substrate of 152 mm square. A preferable offset distance is 240 mm to 280 mm.

The optimum range of a vertical distance (T/S) between the target and the substrate is changed depending on the offset distance. In order to implement the phase angle distribution of ±2 degrees and the transmittance distribution of ±4 degrees in the substrate of 152 mm square, the vertical distance (T/S) between the target and the substrate is to be approximately 200 mm to 380 mm, and preferable T/S is 210 mm to 300 mm.

A target inclination angle influences the film forming speed. In order to obtain a high film forming speed, it is proper that the target inclination angle is 0 to 45 degrees, and a preferable target inclination angle is 10 degrees to 30 degrees.

A sputtering phenomenon changes the temperatures and surface conditions of the target and the shield, and at the same time, the degree of vacuum in the vacuum chamber is also changed. For this reason, it is necessary to always maintain the temperatures and surface conditions of the target and the shield in a constant state between a plurality of substrates continuously and to always hold a sputtering condition in a constant state between the substrates continuously in order to more reduce a variation between blanks and an in-blanks distribution (in-plane variation) of the phase angle and the transmittance as compared with the conventional art. Therefore, it is necessary to use an apparatus capable of continuously holding an interval from the end of the sputtering to the start of next sputtering to be always constant between the substrates. If intermittent sputtering in which the interval from the end of the sputtering to the start of the next sputtering is not constant is carried out as in the conventional art, the states of the target and the shield are changed every moment and a variation in the phase angle and the transmittance is increased correspondingly.

Figure 9:
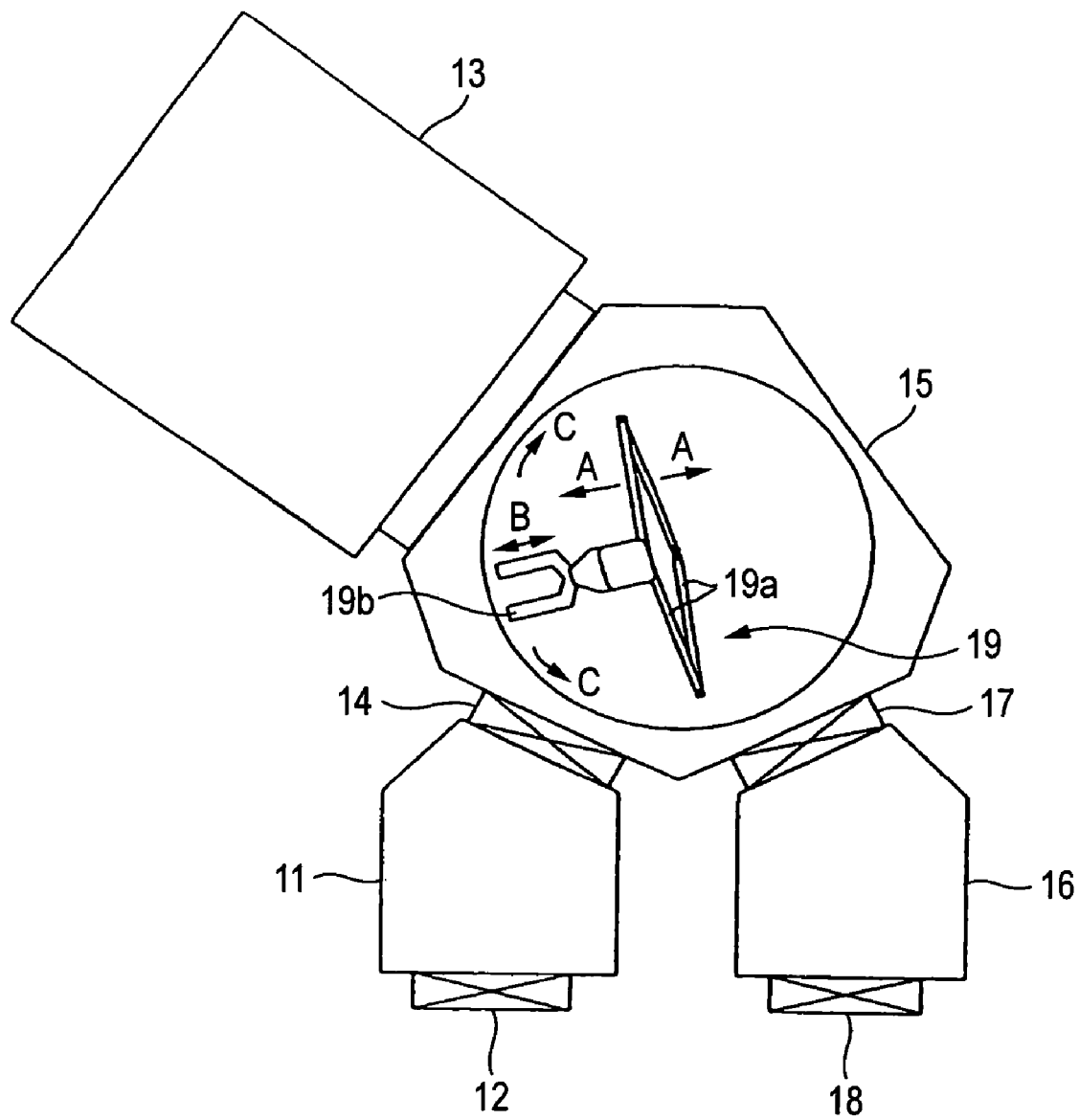
FIG. 9 is a typical view for explaining a delivery system in the DC magnetron sputtering apparatus used in the example.

In order to continuously maintain the temperatures and surface conditions of the target and the shield to be always constant between the substrates and to continuously maintain the sputtering condition to be always constant between the substrates, it is necessary to employ the structure of an apparatus in which a load locking mechanism capable of always holding a vacuum chamber (a sputtering chamber) for carrying out the sputtering in a high vacuum state is provided as shown in FIG. 9 and a substrate can be always introduced from a load locking chamber to the sputtering chamber between the substrates at a constant interval continuously. For this purpose, it is necessary to provide a load locking mechanism for daring to introduce the substrates one by one, and furthermore, to design the volume of the load locking chamber so as to always introduce the substrate from the load locking chamber to the sputtering chamber at a constant interval between the substrates continuously.

In FIG. 9, a valve 12 for isolating the air from a load locking chamber 11 and a valve 14 for isolating the load locking chamber 11 from a sputtering chamber 13 are attached to the load locking chamber 11. The load locking chamber 11 to be provided is designed to be of a sheet contain which can continuously introduce the substrate to the sputtering chamber at a constant interval as described above and to have a predetermined volume. The sputtering chamber 13 has an equivalent function to the vacuum chamber for carrying out the sputtering as shown in FIG. 2 which will be described below. In the case in which the substrate is introduced to the sputtering chamber 13 by means of a robot arm, a delivery chamber 15 may be provided between the sputtering chamber 13 and the load locking chamber 11. In a robot arm 19, an arm 19a is opened or closed in a direction of A shown in the drawing so that a hand 19b can be moved in a direction of B shown in the drawing. Moreover, the robot arm 19 can be rotated in a direction of C shown in the drawing, and furthermore, can be moved in a vertical direction to a paper. In order to enhance the throughput of the formation of a film, moreover, an unload locking chamber 16 having the same structure as the load locking chamber 11 may be added. With reference to FIG. 9, description will be given to an example of a process for forming a light translucent film on a transparent substrate.

1) After the valve 14 is closed, venting is carried out to set the inside of the load locking chamber 11 to have an atmospheric pressure.

2) The valve 12 is opened to introduce a transparent substrate into the load locking chamber 11.

3) The valve 12 is closed to eject a gas from the load locking chamber 11.

4) After the load locking chamber 11 reaches a predetermined degree of vacuum, the valve 14 is opened to move the transparent substrate to the sputtering chamber 13.

5) A light translucent film is formed in the sputtering chamber 13 by using the structure shown in FIG. 2 which will be described below.

6) After the formation of the light translucent film is ended, a valve 17 is opened to move the substrate to the unload locking chamber 16. At this time, it is required that a gas is ejected from the unload locking chamber 16 to have a predetermined degree of vacuum.

7) After the valve 17 is closed, the venting is carried out to set the unload locking chamber to have the atmospheric pressure.

8) A valve 18 is opened to take the substrate out.

The steps 1) to 4) are completed while the formation of the light translucent film in the sputtering chamber 13 is ended and the substrate is moved from the sputtering chamber 13 to the unload locking chamber 16, and a next substrate is caused to stand by in the load locking chamber 11. When the last formation of a film is ended and the substrate is then moved from the sputtering chamber 13 to the unload locking chamber 16, the transparent substrate which is caused to stand by is moved to the sputtering chamber 13, and successively, a light translucent film is formed. In such a process, an interval from the end of the sputtering to the start of the next sputtering can be continuously maintained to be always constant between the substrates excluding the time of the maintenance of the apparatus. Thus, it is possible to continuously maintain the temperatures and surface conditions of the target and the shield to be always constant between the substrates and to continuously hold the sputtering condition to be always constant between the substrates. Consequently, it is possible to stably manufacture halftone phase shift mask blanks having a small fluctuation in a phase angle and a transmittance, for example. More specifically, it is possible to stably manufacture halftone phase shift mask blanks in which variations between the blanks in the phase angle and the transmittance are ±2 degrees and ±4 degrees, respectively.

Next, description will be given to the influence of the material of the light translucent film on the phase angle and the transmittance. The phase angle and the transmittance of the light translucent film are changed depending on a film forming speed and a degree of nitriding. The film forming speed and the degree of nitriding are influenced by a partial pressure of nitrogen in sputtering. In a state in which the light translucent film is completely nitrided, the influence of the partial pressure of the nitrogen in the sputtering is reduced. By regulating the flow of the nitrogen to be introduced into the sputtering in such a manner that the content of the nitrogen measured by ESCA is larger than that of silicon in a metal silicide film which is nitrided, it is possible to reduce the influence of a fluctuation in the partial pressure of the nitrogen on an optical characteristic. By using this method, it is also possible to reduce the in-plane distributions of the phase angle and the transmittance at the same time. In the case in which oxygen is added together with the nitrogen in the sputtering, the phase angle and the transmittance are greatly influenced by a fluctuation in the flow of the oxygen. At least the influence of a fluctuation in the flow of the nitrogen can be lessened by the method described above.

A photomask blank according to the invention includes a opaque film (chromium, a chromium compound containing oxygen, nitrogen and carbon in the chromium or other chromium compounds), for example, in a photomask and a phase shift film in a phase shift mask blank.

Moreover, the phase shift mask blank according to the invention can also be applied to a blank for manufacturing other phase shift masks, for example, a Levenson contain, an auxiliary pattern contain or a self-alignment contain (an edge highlighting contain) in order to set a variation in the phase angle to be ±2 degrees in addition to a halftone contain phase shift mask blank.

EXAMPLE

An example of the invention will be described below in more detail.

By using the DC magnetron sputtering apparatus described above with reference to FIGS. 7 to 9, 100 halftone contain phase shift mask blanks for an ArF excimer laser (193 nm) were fabricated one by one by continuously forming a film at a constant interval.

More specifically, a thin film (a thickness of approximately 670 angstroms) of molybdenum and silicon (MoSiN) nitrided on a transparent substrate (a quartz substrate of 6-inch square having a thickness of 0.25 inch) was formed through reactive sputtering (DC sputtering) in a mixed gas atmosphere (Ar: $N_2$=10%:90%, a pressure: 0.1 Pa) of argon (Ar) and nitrogen ($N_2$) by using a mixed target (Mo:Si=8:92 mol %) of molybdenum (Mo) and silicon (Si) so that a phase shift mask blank (a film composition of Mo:Si:N=7:45:48) for an ArF excimer laser (a wavelength of 193 nm) was obtained.

In the example, as shown in FIG. 7, there was used the apparatus having a structure in which the sputtering target 2 and the substrate 6 are provided in such a manner that their opposed surfaces have a predetermined angle. In this case, an offset distance between the sputtering target and the substrate shown in FIG. 8 was set to be 340 mm and a vertical distance (T/S) between the target and the substrate was set to be 380 mm, and a target inclination angle was set to be 15 degrees.

The phase angle of a light translucent film was regulated by a sputtering time and a phase angle in an exposure wavelength was regulated to be approximately 180 degrees.

Figure 5:
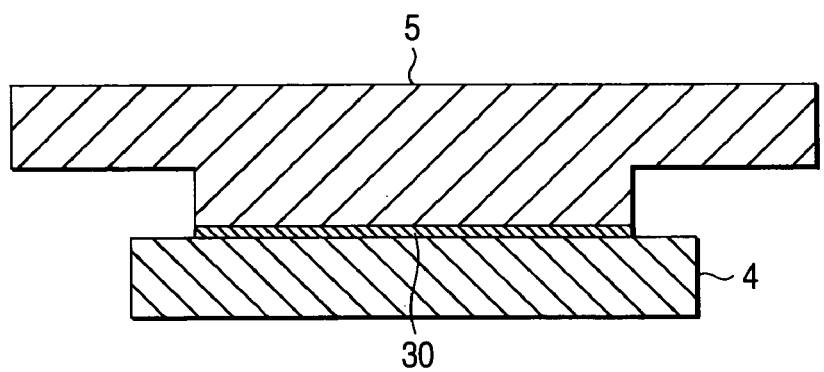
FIG. 5 is a typical view showing an embodiment of a sputtering target used in a comparison example.
Figure 6:
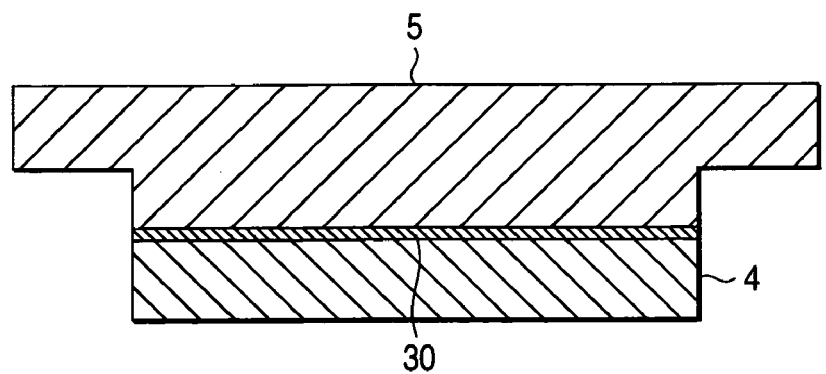
FIG. 6 is a typical view showing an embodiment of another sputtering target used in the comparison example.

In the example, in the DC magnetron sputtering apparatus shown in FIG. 7, a sputtering target A shown in FIG. 1, a sputtering target B shown in FIG. 5 (the sputtering target shown in FIG. 1 onto which copper is not sprayed), and a sputtering target C shown in FIG. 6 were used respectively. In each of the sputtering targets, oxygen free copper is used for the backing plate 4 and indium is used for bonding the sputtering target 5 to the backing plate 4.

Thus, the number of defects (unit:piece) for one of 100 films was checked. A result is shown in Table 1.

TABLE 1

|  | Target A | Target B | Target C |
| --- | --- | --- | --- |
| Pinhole of 0.2 μm or more | 0.2 | 1.1 | 12.1 |
| Particle of 0.2 μm or more | 0.4 | 2.1 | 15.8 |

In the case in which the target A was used, indium contain particles intended for the application were not detected. Moreover, it was confirmed that the rate of generation of a pinhole and the number of particles are correspondingly reduced remarkably.

In the case in which the target C was used, a large number of indium contain particles intended for the application were detected, and the rate of generation of a pinhole and the number of particles were increased correspondingly.

In the case in which the target B was used, it was confirmed that the indium contain particles intended for the application are more reduced, and the rate of generation of a pinhole and the number of particles are decreased correspondingly as compared with the case in which the target C is used.

While the invention has been described above by taking the preferable example, the invention is not restricted to the example.

For instance, while molybdenum has been used as a metal for constituting the light translucent film, it is not restricted but zirconium, titanium, vanadium, niobium, tantalum, tungsten, nickel and palladium can be used.

While a target constituted by molybdenum and silicon has been used as a target containing a metal and the silicon, moreover, it is not restricted. In the target containing the metal and the silicon, the molybdenum is particularly excellent in the metal in that the controllability of a transmittance and a target density in the case in which a sputtering target containing the metal and the silicon is used are high, and particles in a film can be decreased. Although the titanium, the vanadium and the niobium are excellent in a durability to an alkali solution, they are slightly worse in the target density than the molybdenum. Although the tantalum is excellent in the durability to the alkali solution and the target density, they are slightly worse in the controllability of a transmittance than the molybdenum. Although the tungsten has very similar properties to those of the molybdenum, it is slightly worse in a discharging characteristic in sputtering than the molybdenum. Although the nickel and the palladium are excellent in an optical characteristic and a durability to an alkali solution, dry etching is slightly hard to perform. Although the zirconium is excellent in the durability to the alkali solution, it is worse in the target density than the molybdenum and the dry etching is slightly hard to perform. In consideration of the foregoing, at present, the molybdenum is the most preferable. For the thin film (light translucent film) of the molybdenum and the silicon (MoSiN) which is nitrided, the molybdenum is preferable in that it is excellent in a chemical resistance such as an acid resistance or an alkali resistance.

In order to obtain a thin film having a composition to meet various characteristics of a phase shift mask while maintaining a discharging stability in the formation of the film, moreover, it is preferable that a target containing 70 to 95 mol % of silicon and a metal should be subjected to DC magnetron sputtering in an atmosphere containing nitrogen, thereby forming a light translucent film containing nitrogen, a metal and silicon.

The reason is as follows. If the content of the silicon in the target is larger than 95 mol %, a voltage is applied onto the surface of the target (an erosion portion) with difficulty (an electricity moves in a stream with difficulty) in DC sputtering so that a discharge becomes unstable. If the same content is smaller than 70 mol %, a film constituting a light translucent portion having a high light transmittance cannot be obtained. Moreover, the discharging stability can further be enhanced by the combination of a nitrogen gas and the DC sputtering.

The discharging stability in the formation of a film also influences the quality of the film. With an excellent discharging stability, it is possible to obtain a light translucent film of high quality.

It will be apparent to those skilled in the art that various modifications and variations can be made to the described preferred embodiments of the present invention without departing from the spirit or scope of the invention. Thus, it is intended that the present invention whole-area modifications and variations of this invention consistent with the scope of the appended claims and their equivalents.

What is claimed is:

1. A method of manufacturing a mask blank having a thin film for forming a mask pattern on a substrate, the method comprising:

forming said thin film by a sputtering method using a sputtering target comprising a target member and a backing plate that are bonded to each other with a bonding agent, and wherein the target member has a flange portion extending from a whole periphery of a bonding portion of the backing plate, a bonding-side area of said target member is larger than an area of the bonding portion of the backing plate such that a concave portion is formed by the target member, the backing plate and the bonding agent, and wherein a metal film is deposited in an amount to contact with said target member, said backing plate and said bonding agent and cover the bonding agent and fill over half of a space of the concave portion.

2. The method of manufacturing a mask blank according to claim 1, wherein the target surface of the sputtering target is faced diagonally downward.

3. The method of manufacturing a mask blank according to claim 1, wherein the backing plate has a base portion and the bonding portion, said bonding portion being protruded convexly from the base portion in order to bond the target member on a top surface thereof.

4. The method of manufacturing a mask blank according to claim 3, wherein said thin film is formed by a sputtering method using a whole-area erosion contain magnetron cathode.

5. The method of manufacturing a mask blank according to claim 1, wherein the metal film is formed by spraying.

6. The method of manufacturing a mask blank according to claim 1, wherein the metal film is formed of a material containing copper.

7. The method of manufacturing a mask blank according to claim 1, wherein said thin film is formed while a surface of the substrate is provided upward and a target surface of the sputtering target is provided at an angle of 0 to 90 degrees to a direction of gravity.

8. The method of manufacturing a mask blank according to claim 1, wherein the metal film is formed to fill an almost entire space of the concave portion.

9. The method of manufacturing a mask blank according to claim 1, wherein the thin film is formed using a DC magnetron sputtering apparatus.

10. A sputtering apparatus for manufacturing a mask blank having a thin film to be formed by sputtering deposition for forming a pattern on a substrate, comprising;

a sputtering chamber, a substrate holding table for holding a substrate which surface to face upward, a sputtering target being opposed to said substrate and having a target member and a backing plate, where said target member and said backing plate are bonded to each other with a bonding agent, wherein the target member has a flange portion extending from a whole periphery of a bonding portion of the backing plate, wherein a bonding-side area of said target member is larger than an area of the bonding portion of the backing plate such that a concave portion is formed by the target member, the backing plate and the bonding agent, and wherein a metal film is deposited in an amount to contact with said target member, said backing plate and said bonding agent and cover the bonding agent and fill over half of a space of the concave portion.

11. The sputtering apparatus according to claim 10, wherein said backing plate has a base portion and the bonding portion, where said bonding portion is a portion which is convexity protruded from the base portion in order to bond the target member on a top surface thereof.

12. The sputtering apparatus according to claim 10, wherein a whole area erosion magnetron cathode is provided to the backside of the sputtering target.

13. The sputtering apparatus according to claim 10, wherein the metal film is formed by spraying.

14. The sputtering according to claim 10, wherein the metal film is formed of a material containing copper.

15. The sputtering apparatus according to claim 10, wherein the metal film is formed to fill an almost entire space of the concave portion.

16. The sputtering apparatus according to claim 10, wherein the target surface of the sputtering target is faced diagonally downward.

17. The sputtering apparatus according to claim 10, wherein the sputtering apparatus is a DC magnetron sputtering apparatus.

18. A sputtering target for manufacturing a mask blank which is used for manufacturing a mask blank having a thin film to form a pattern on a substrate, comprising:
- a backing plate which has a bonding portion which is bonded to a target member via a bonding agent;
- the target member, whose surface area is larger than an area of the bonding portion of the backing plate, and which has a flange portion extending from a whole periphery of the bonding portion of the backing plate, wherein the target member is bonded to the bonding portion such that a concave portion is formed by the target member, the backing plate and the bonding agent; and
- a metal film which is deposited in an amount to contact with said target member, said backing plate and said bonding agent and cover the bonding agent and fill over half of a space of the concave portion.

19. The sputtering target for manufacturing a mask blank according to claim 18, wherein the target member is positioned on a gravity direction side from the bonding agent when the thin film is to be formed.

20. The sputtering target according to claim 18, wherein the metal film is formed by spraying.

21. The sputtering target according to claim 18, wherein the metal film is formed of a material containing copper.

22. The sputtering target according to claim 18, wherein the backing plate has a base portion, and the bonding portion is convexly protruded from the base portion and bonded to the target member on a top surface thereof.

23. The sputtering target according to claim 18, wherein the metal film is formed to fill an almost entire space of the concave portion.

\* \* \* \* \*